US007004033B2

(12) United States Patent
Katayama

(10) Patent No.: US 7,004,033 B2
(45) Date of Patent: Feb. 28, 2006

(54) PRESSURE SENSOR CONTAINED IN CASING

(75) Inventor: Norihiro Katayama, Obu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/974,725

(22) Filed: Oct. 28, 2004

(65) Prior Publication Data
US 2005/0155432 A1 Jul. 21, 2005

(30) Foreign Application Priority Data
Jan. 21, 2004 (JP) ............................. 2004-013380

(51) Int. Cl.
*G01L 7/00* (2006.01)
(52) U.S. Cl. ....................................... 73/706
(58) Field of Classification Search ................ 73/706, 73/290 R, 299, 717, 754, 708, 756, 40; 264/279.1; 417/63; 29/621.1
See application file for complete search history.

(56) References Cited

U.S. PATENT DOCUMENTS
4,782,703 A * 11/1988 Nishi ........................ 73/708
5,325,716 A * 7/1994 Hafner et al. .............. 73/301
6,505,505 B1 * 1/2003 Henzinger et al. ......... 73/118.2

FOREIGN PATENT DOCUMENTS
JP   A-11-304619   11/1999
JP   A-2001-304999  10/2001

* cited by examiner

*Primary Examiner*—William Oen
(74) *Attorney, Agent, or Firm*—Posz Law Group, PLC

(57) ABSTRACT

A pressure sensor for detecting, e.g., an intake manifold pressure of an internal combustion engine is composed of a resin casing, a sensing member contained in the casing and conductor members embedded in the resin casing. The conductor members are disposed around the sensing member, and the sensing member is electrically connected to the conductor members by wire-bonding. Boundaries between the resin casing and the conductor members are sealed with an encapsulating member which is applied to the position at liquid state and dried thereafter. To prevent the liquid encapsulating member from flowing out of the applied position toward the sensing member, a bank is formed between the sensing member and the position where the encapsulating member is applied. A depressed portion for retaining the encapsulating member therein may be additionally formed next to the bank.

7 Claims, 3 Drawing Sheets

PRESSURE SENSOR CONTAINED IN CASING

CROSS-REFERENCE TO RELATED APPLICATION

This application is based upon and claims benefit of priority of Japanese Patent Application No. 2004-13380 filed on Jan. 21, 2004, the content of which is incorporated herein by reference.

BACKGROUND OF THE INVENTION

1. Field of the Invention

The present invention relates to a pressure sensor contained in a casing and encapsulated by an encapsulating member.

2. Description of Related Art

Examples of this kind of pressure sensor are disclosed in JP-A-11-304619 and JP-A-2001-304999. The pressure sensor is composed of a resin casing, a sensing member contained in the casing, conductor members embedded in the casing and electrically connected to the sensing member, and a member for encapsulating boundaries between the conductor members and the casing. A pressure such as an intake manifold pressure of an automobile is applied to the sensing member, and the sensing member outputs electrical signals corresponding to the applied pressure.

A relevant portion of a conventional pressure sensor is shown in FIG. 8 attached hereto. A sensing member 20 is contained in a resin casing 10 having a conductor member 30 embedded therein. The sensing member 20 is composed of a glass base 22 and a diaphragm-type semiconductor sensor chip mounted on the glass base 22. The sensing member 20 is connected to the casing 10 with adhesive 23. The sensing element 20 is electrically connected to the conductor member 30 serving as a terminal with a bonding wire 40. The boundaries between the conductor members 30 and the casing 10 are encapsulated with an encapsulating member 50. The encapsulating member 50 is made of a material such as fluorine-rubber which is liquid when applied and is hardened afterward. The encapsulating member 50 prevents air bubbles from coming out through the boundaries between the casing 10 and the conductor members 30 when the pressure sensor is exposed to a negative pressure. A protecting member 60 made of a material such as fluorine gel is further disposed on the sensing member 20 and the encapsulating member 50 to protect them from chemical erosion.

The encapsulating member 50 is applied to the position when it is in liquid state, and it is hardened thereafter. In the conventional pressure sensor, as shown in FIG. 8, the conductor member 30 is positioned below the surface of the sensing member 20 in order to prevent the encapsulating member 50 from flowing toward the sensing member 20 and from sticking to the surface thereof. For this purpose the conductor member 30 has to be positioned at a bottom portion of the casing 10. Accordingly, a step is made between the surfaces of the sensing member 20 and the conductor member 30. This step is not advantageous for a process of forming the bonding wire 40 between the sensing member 20 and the conductor member 30. Further, the step makes the thickness (a vertical dimension of the pressure sensor shown in FIG. 8) large. For keeping the encapsulating member 50 in position when it is applied, the conductor member 30 has to be positioned lower than the sensing member 20 in the casing 10. Therefore, the casing 10 cannot be freely designed.

SUMMARY OF THE INVENTION

The present invention has been made in view of the above-mentioned problem, and an object of the present invention is to provide an improved pressure sensor, wherein the conductor member is freely positioned in the resin casing.

The pressure sensor detects a pressure such as a pressure in an intake manifold of an automotive vehicle. The pressure sensor is composed of a resin casing, a sensing member contained therein, and conductor members embedded in the resin casing and disposed around the sensing member. The conductor member is used as a terminal to which the sensing member is electrically connected by, e.g., wire-bonding. The sensing member may be composed of a diaphragm-type semiconductor sensor chip. A pressure to be detected is applied to the sensing member, and the sensing member outputs electrical signals corresponding to the pressure applied thereto.

Boundaries between the resin casing and the conductor members embedded in the casing are sealed with an encapsulating member after the sensing member is electrically connected to the conductor member by wire-bonding. The encapsulating member is in liquid state when it is applied to the position, and the encapsulating member is dried thereafter. To prevent the encapsulating member from flowing toward the sensing member and from sticking to the surface thereof, a bank projecting from the casing is formed between the sensing member and the place where the encapsulating member is applied.

The encapsulating member, in the liquid state, applied to the boundaries between the resin casing and the conductor member is retained there by the bank. Therefore, it is not necessary to position the surface of the conductor member lower than the surface of the sensing member as done in the conventional sensor device mentioned above. The position of the conductor member relative to the sensing member in the resin casing is freely chosen. When the surfaces of the sensing member and the conductor member are positioned in the same level, a step between both surfaces can be eliminated, and thereby the pressure sensor can be made thin.

A depressed portion for retaining the encapsulating member therein may be made next to the bank in the resin casing. A projected portion exposing to an upper space above the encapsulating member may be formed on the conductor member. In this case, the sensing member is electrically connected to the projected portion by wire-bonding. The projected portion may be formed by making a portion of the conductor member thicker than other portions or by bending a portion of the conductor member.

Other objects and features of the present invention will become more readily apparent from a better understanding of the preferred embodiments described below with reference to the following drawings.

DETAILED DESCRIPTION OF THE PREFERRED EMBODIMENTS

A first embodiment of the present invention will be described with reference to FIG. 1. A pressure sensor 100 is used as a pressure sensor for detecting an intake manifold pressure in an automotive vehicle. Since this pressure sensor 100 is exposed to gasoline or other chemical substances, it has to be well protected from those substances.

Figure 1:
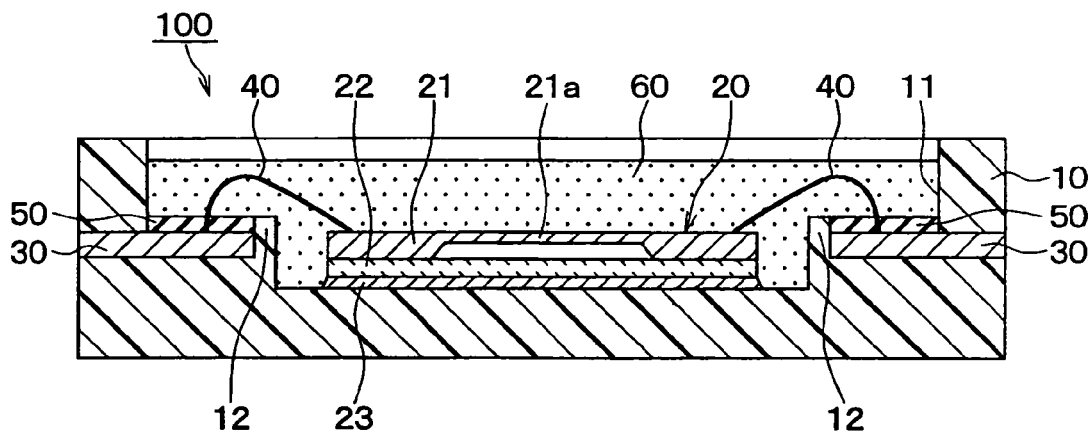
FIG. 1 is a cross-sectional view showing a pressure sensor as a first embodiment of the present invention.

As shown in FIG. 1, a sensing member 20 is contained in a resin casing 10 and electrically connected to conductor members 30 embedded in the casing 10 with bonding wires 40. The sensing member 20 is covered with a protecting member 60 filling an upper space in the casing 10. The casing 10 is made by molding a resin material such as polyphenylene sulfide (PPS), polybutylene terephthalate (PBT), epoxy or the like. An opening 11 is formed at an upper portion of the casing 10.

The conductor members 30 serving as terminals to be connected to the sensing member 20 are embedded in the resin casing 10. The conductor member 30 is made of a conductive material such as copper. A portion of the conductor member 30 is exposed to the upper space in the casing 10, as shown in FIG. 1. The exposed portion is plated with gold so that it serves as a bonding pad for making an electrical connection between the sensing member 20 and the conductor member 30. The conductor member 30 is also electrically connected to an outside circuit (not shown).

The sensing member 20 is composed of a glass base 22 and a diaphragm-type semiconductor sensor chip 21 mounted on the glass base 22. The sensor chip 21 may be formed by a thin diaphragm 21a including known piezo-electric elements. The thin diaphragm 21a distorts when a pressure is applied thereto, and the sensor chip 21 generates an electrical signal corresponding to the pressure. The sensing member 20 composed of the sensor chip 21 and the glass base 22 is bonded to the casing 10 with adhesive 23 such as silicone rubber. The sensing member 20 is electrically connected to the conductor members 30 through bonding wires 40 made of a material such as gold or aluminum.

Figure 8:
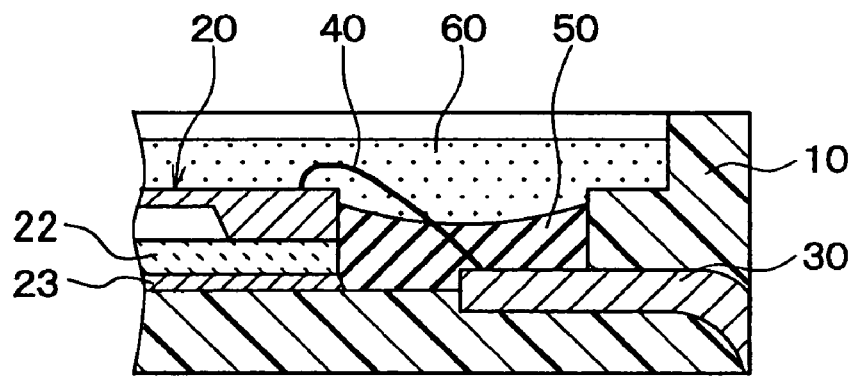
FIG. 8 is a cross-sectional view partially showing a conventional pressure sensor.

The conductor members 30 embedded in the casing 10 are positioned around the sensing member 20 as shown in FIG. 1. In this embodiment, the upper surface of the conductor member 30 and the upper surface of the sensing member 20 are positioned at a substantially equal level. The step between both surfaces formed in the conventional pressure sensor shown in FIG. 8 is eliminated. By eliminating the step, the pressure sensor is made thinner than the conventional one. The boundaries between the conductor members 30 and the resin casing 10 are sealed or encapsulated by the encapsulating member 50 made of an insulating material. Further, the upper space of the casing 10 is filled with a protecting member 60 made of an insulating material to cover the sensing member 20, the bonding wires 40 and the encapsulating member 50. Thus, the portions electrically connecting components are covered with the encapsulating member 50 and the protecting member 60, and protected from erosion from outside.

As shown in FIG. 1, the encapsulating member 50 is disposed to cover the connecting portion between the bonding wire 40 and the conductor member 30, and the boundaries between the casing 10 and the conductor member 30, while leaving an upper portion of the bonding wire 40 exposed from the encapsulating member 50. The encapsulating member 50 and the protecting member 60 may be made of the materials disclosed in the documents mentioned above (JP-A-11-304619, JP-A-2001-304999).

The encapsulating member 50 is made of a material having a high elasticity modulus to prevent generation of air bubbles at the boundaries between the conductor member 30 and the casing 10. The encapsulating member 50 made of a material such as fluorine-rubber is soft or in liquid state when it is applied to the position (pasted), and thereafter the encapsulating member 50 is hardened. The protecting member 60 is made of a material having a low elasticity modulus so that it does not give a stress to the sensing member 20 and bonding wires 40. The protecting member 60 may be made of a material such as fluorine-type gel or fluorosilicone gel. Both of the encapsulating member 50 and the protecting member 60 are made of a material that is highly resistive to chemical substances. As shown in FIG. 1, banks 12 projecting from the bottom surface of the casing 10 are formed integrally with the casing 10. The bank 12 prevents the encapsulating member 50 from flowing toward the surface of the sensing member 20 and from sticking thereto.

The pressure sensor 100 described above is manufactured in the following manner. The resin casing 10 in which the conductor members 30 are embedded is formed by molding. The sensing member 20 is mounted on the casing 10 by bonding with the adhesive 23. Then, the sensing element 20 and the conductor members 30 are electrically connected by wire-bonding. Then, the encapsulating member 50 is applied to the place and the protecting member 60 is supplied into the upper space of the casing 10. Then, the encapsulating member 50 and the protecting member 60 are hardened. Thus, the pressure sensor 100 is completed. The pressure sensor 100 is mounted on the intake manifold of an engine, so that the opening 11 of the casing 10 communicates with the intake passage to detect the pressure in the intake manifold.

In the pressure sensor 100 described above, the banks 12 projecting from the bottom of the casing 10 are formed. Therefore, the encapsulating member 50 is effectively prevented from flowing to the surface of the sensing member 20 and from sticking thereto. The vertical position of the conductor member 30 may be equal to the surface of the sensing member. It is not necessary to position the conductor members 30 at the lower portion of the casing 10 as done in the conventional pressure sensor. By positioning the sensing member 20 and the conductor members 30 at the same vertical level, the step between the surfaces of both members, which was made in the conventional pressure sensor, is eliminated. Therefore, the process of wire-bonding is easily performed, and the vertical size (or the thickness) of the pressure sensor 100 can be made small.

Figure 2:
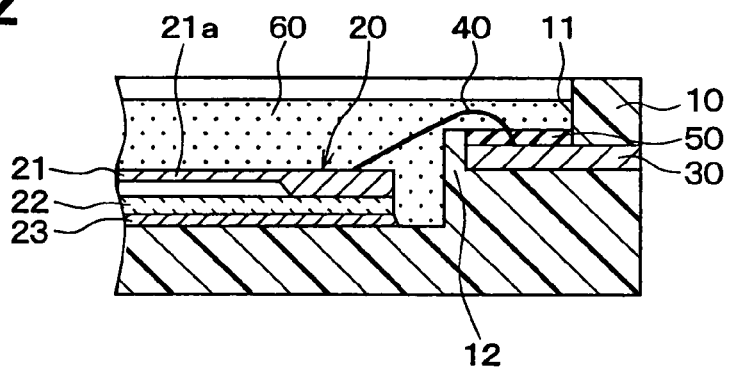
FIG. 2 is a cross-sectional view partially showing a modified form of the first embodiment shown in FIG. 1.

A modified form of the first embodiment shown in FIG. 1 is shown in FIG. 2. In this modified form, the conductor member 30 is positioned at a higher level than the sensing member 20. The encapsulating member 50 pasted in the liquid state is prevented from flowing out by the bank 12, though the liquid encapsulating member 50 is positioned hither than the sensing member 20.

Figure 3:
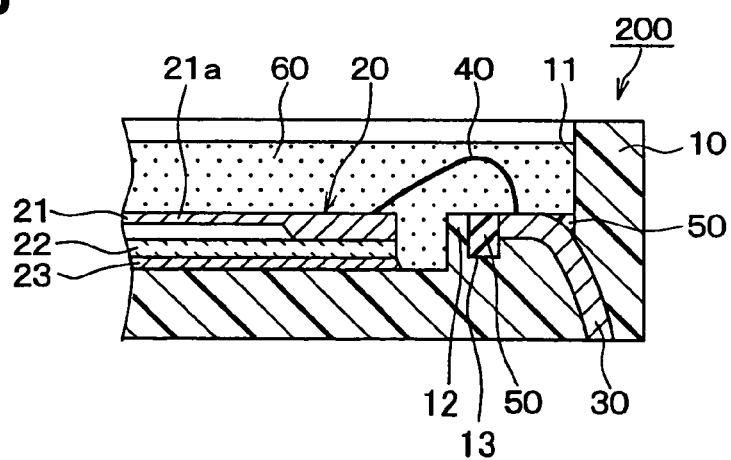
FIG. 3 is a cross-sectional view partially showing a pressure sensor as a second embodiment of the present invention.
Figure 4:
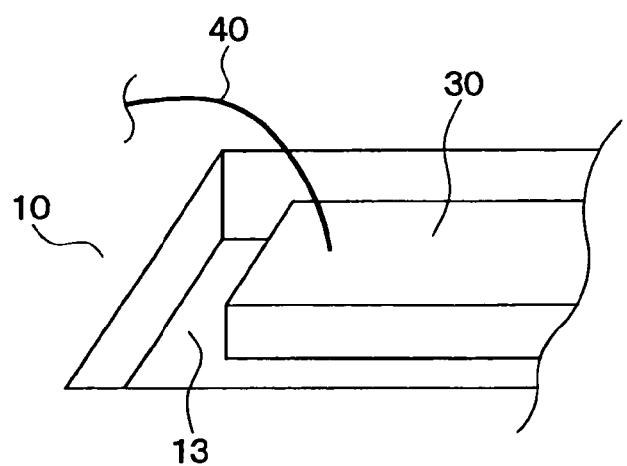
FIG. 4 is a perspective view showing a depressed portion for retaining an encapsulating member therein, the depressed portion being formed in the second embodiment shown in FIG. 3.

A second embodiment of the present invention is shown in FIG. 3. In this embodiment, a depressed portion 13 is additionally formed next to the bank 12, so that the encapsulating member 50 is retained in the depressed portion 13. FIG. 4 shows the depressed portion 13 in a perspective view. As seen in FIG. 4, the depressed portion 13 is formed in shape of a groove surrounding the conductor member 30. The encapsulating member 50 is more effectively prevented from flowing out by the depressed portion 13 and the bank 12. In this embodiment, the portion connecting the bonding wire 40 to the conductor member 30 is not covered with the encapsulating member 50, but this portion is covered only with the protecting member 60.

Figure 5:
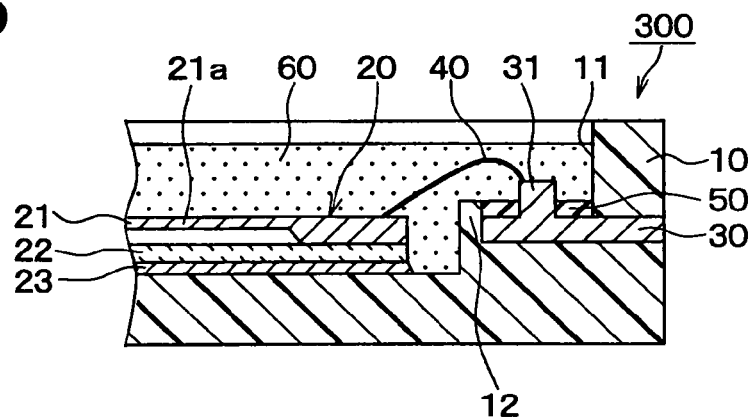
FIG. 5 is a cross-sectional view partially showing a pressure sensor as a third embodiment of the present invention.

A third embodiment of the present invention is shown in FIG. 5. In this embodiment, a projected portion 31 sticking out from the encapsulating member 50 is formed on the conductor member 30. The projected portion 31 may be formed in the process of forming the conductor member 30 by presswork or by partially laminating a plate. The bonding wire 40 is connected to the projected portion 31 sticking out from the encapsulating member 50. The connecting portion is not covered with the encapsulating member 50, but it is covered with the protecting member 60.

Figure 6:
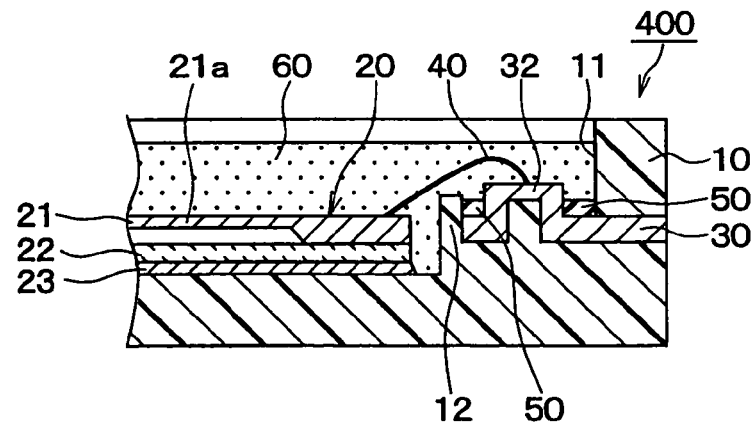
FIG. 6 is a cross-sectional view partially showing a pressure sensor as a fourth embodiment of the present invention.
Figure 7:
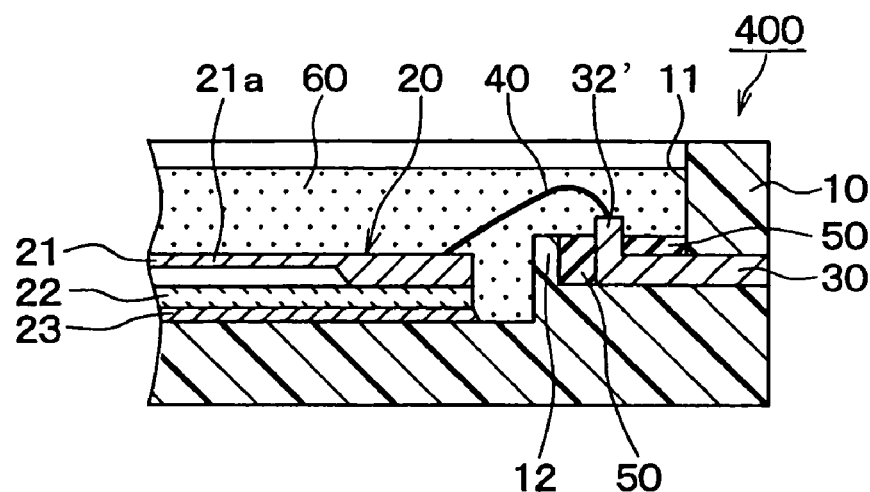
FIG. 7 is a cross-sectional view partially showing a modified form of the fourth embodiment shown in FIG. 6.

A fourth embodiment of the present invention is shown in FIG. 6. In this embodiment, a projected portion 32 is formed by bending the conductor member 30 in U-shape. The projected portion 32 can be easily formed in the process of forming the conductor member 30 by presswork. FIG. 7 shows a modified form of the fourth embodiment. In this modified form, an angled portion 32' is formed by bending the tip of the conductor member 30 in the presswork for forming the conductor member 30. In the fourth embodiment, the portion connecting the bonding wire 40 and the conductor member 30 is not covered with the encapsulating member 50, but it is covered with the protecting member 60.

The present invention is not limited to the embodiments described above, but it may be variously modified. For example, the casing 10 may be made of a material other than resin. The conductor member 30 is not limited to the terminal to be connected to the sensing member 20. The sensing member 20 may not be limited to the diaphragm-type semiconductor chip. The sensing member 20 may be a capacitive-type or a piezoelectric-type. The protecting member 60 filling the upper portion of the casing 10 may be eliminated in a certain application. The sensing member 20 and the conductor member 30 may be electrically connected by other methods than wire-bonding. They may be connected by soldering or by conductive adhesive. The vertical level of the conductor member 30 relative to the sensing member 20 can be freely selected as long as the encapsulating member 50 is prevented from flowing out by the bank 12 and/or the depressed portion 13. The pressure sensor according to the present invention is applicable as sensors other than the intake manifold pressure sensor.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A pressure sensor comprising:
   a casing;
   a sensing member for detecting a pressure applied thereto and for generating electrical signals according to the detected pressure, the sensing member being contained in the casing;
   a conductor member embedded in the casing and disposed around the sensing member, the conductor member being electrically connected to the sensing member;
   an encapsulating member for encapsulating boundaries between the conductor member and the casing, the encapsulating member being a liquid material when it is applied to the boundaries and being hardened thereafter; and
   a bank for preventing the encapsulating member from flowing toward the sensing member when the encapsulating member is applied, the bank being formed integrally with the casing.

2. The pressure sensor as in claim 1, wherein:
the bank is positioned between the sensing member and the encapsulating member.

3. The pressure sensor as in claim 2, wherein:
the bank is projected from a surface of the casing.

4. The pressure sensor as in claim 2, wherein:
the casing further includes a depressed portion for retaining the encapsulating member therein, the depressed portion being formed next to the bank.

5. The pressure sensor as in claim 2, wherein:
the conductor member includes a portion projected from a surface thereof, the projected portion being exposed above the encapsulating member.

6. The pressure sensor as in claim 5, wherein:
the projected portion is formed by making a portion of the conductor member thicker than other portions.

7. The pressure sensor as in claim 5, wherein:
the projected portion is formed by bending a portion of the conductor member.

* * * * *